(12) United States Patent
Said

(10) Patent No.: US 7,053,803 B1
(45) Date of Patent: May 30, 2006

(54) DATA COMPRESSION

(75) Inventor: Amir Said, Cupertino, CA (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/060,730

(22) Filed: Jan. 31, 2005

(51) Int. Cl.
*H03M 7/00* (2006.01)
*G06F 13/12* (2006.01)
*G06F 13/38* (2006.01)

(52) U.S. Cl. .......................... 341/107; 710/68
(58) Field of Classification Search ................ 341/107, 341/50, 51, 59, 60, 87; 704/500, 503; 382/232; 710/68; 707/101; 375/240
See application file for complete search history.

(56) References Cited

U.S. PATENT DOCUMENTS

| | | | | |
|---|---|---|---|---|
| 4,652,856 A | * | 3/1987 | Mohiuddin et al. | 341/60 |
| 4,862,167 A | * | 8/1989 | Copeland, III | 341/107 |
| 5,389,922 A | * | 2/1995 | Seroussi et al. | 341/51 |
| 5,471,207 A | * | 11/1995 | Zandi et al. | 341/107 |
| 5,959,560 A | * | 9/1999 | Said et al. | 341/107 |
| 6,262,675 B1 | * | 7/2001 | Iyer | 341/51 |
| 6,359,548 B1 | * | 3/2002 | Cooper | 341/50 |
| 6,373,408 B1 | * | 4/2002 | Kimura et al. | 341/59 |
| 6,392,568 B1 | * | 5/2002 | Cooper | 341/51 |
| 6,606,037 B1 | * | 8/2003 | Ekstrand et al. | 341/50 |
| 6,606,040 B1 | * | 8/2003 | Abdat | 341/87 |
| 6,798,362 B1 | * | 9/2004 | Modha | 341/51 |
| 2004/0032989 A1 | | 2/2004 | Sakaguchi | |

OTHER PUBLICATIONS

Said, A., "Arithmetic Coding", Chapter 5 of Sayood, K. (ed.), Lossless Compression Handbook, Academic Press, San Diego, CA, 2003, no month.
Said, A., "Comparitive Analysis of Arithmetic Coding Computational Complexity", HP Labs Technical Report, HPL-2004-75, Palo Alto, CA, Apr. 2004, no date.
Entropy Coding (EC), http://www.data-compression.info/Algorithms/EC/, downloaded Jan. 31, 2005.
Entropy Coding, http://www.debufmode.com/imagecmp/entrcode.htm., downloaded Jan. 31, 2005.
Arithmetic Encoding, http://planetmath.org/encyclopedia/ArthimeticEncoding.html., downloaded Jan. 31, 2005.
Entropy Encoding, http://planetmath.org/encyclopedia/EntropyEncoding.html., downloaded Jan. 31, 2005.
Huffman Coding, http://planetmarth.org/encyclopedia/HuffmanCoding.html., downloaded Jan. 31, 2005.

* cited by examiner

Primary Examiner—Patrick Wamsley

(57) ABSTRACT

In a process for data compression, data to be encoded is received. The received data is based on an alphabet including one or more symbols and coded bits are assigned to each symbol of the received data. In addition, the coded bits are based on a probability estimation using a variable probability estimation factor.

30 Claims, 6 Drawing Sheets

DATA COMPRESSION

BACKGROUND

Although compression applications employ a wide variety of techniques and have different degrees of complexity, they share some common processes. Typical processes used for data compression include numerical processing, logical processing, source modeling and entropy encoding. These processes depend on the data type, and they may be performed in any order or they may be combined.

Numerical processing, like predictive encoding and linear transforms, is normally used for waveform signals, such as images or audio. Logical processing consists of changing the data to a form more suited for compression, such as run-lengths, zero-trees, set-partitioning information or dictionary entries. The source modeling stage is used to account for variations in the statistical properties of the data. Source modeling is responsible for gathering statistics and identifying data contexts that make the source models more accurate and reliable.

What most compression systems have in common is the fact that the final process is entropy encoding, that is, the process of representing information in the most compact form. Entropy encoding may be responsible for doing most of the compression work, or it may complement what has been accomplished by previous stages.

One method of entropy encoding is arithmetic encoding. Among its most desirable features are the following:

(1) When applied to independent and identically distributed (i.i.d.) sources, the compression of each symbol is provably optimal.

(2) It simplifies automatic modeling of complex sources, yielding near-optimal or significantly unproved compression for sources that are not i.i.d.

(3) It is effective in a wide range of situations and compression ratios. The same arithmetic encoding implementation can effectively code all the diverse data created by the different processes of data compression, such as modeling parameters, transform coefficients, signaling, etc.

(4) Its main process is arithmetic, which is supported with ever-increasing efficiency by all general-purpose or digital signal processors (CPUs, DSPs).

(5) It is suited for use as a "compression black-box" by those that are not encoding experts or do not want to implement the encoding algorithm themselves.

However, the compression of arithmetic coding is sufficient only if the values of the source symbol probabilities that it uses for coding are sufficiently accurate. In real-world applications, the probabilities are not always known ahead of time. Instead, the probabilities are often estimated "on-the-fly", as symbols are coded. Consequently, arithmetic coding compression efficiency is determined by the efficiency of the mechanism that is used to estimate probabilities.

It would be desirable to use a probability estimation technique with arithmetic coding that is capable of reaching a relatively high level of accuracy in a relatively quick manner.

SUMMARY

A process for data compression is described. In the process, data to be encoded is received, where the received data is based on an alphabet including one or more symbols. Coded bits are assigned to each symbol of the received data and the coded bits are based on a probability estimation using a variable probability estimation factor.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present embodiment is described by referring mainly to an exemplary embodiment thereof. In the following description, numerous specific details are set forth in order to provide a thorough understanding of the present embodiment. It will be apparent however, to one of ordinary skill in the art, that the present embodiment may be practiced without limitation to these specific details. In other instances, well known methods and structures have not been described in detail so as not to unnecessarily obscure the present embodiment.

As described in greater detail herein below, data to be compressed is encoded using arithmetic encoding. More particularly, the data is encoded based on a probability estimation using a variable probability estimation factor. The data includes data based on an alphabet having one or more symbols. In arithmetic encoding, one data symbol at a time is coded by assigning a real-valued number of bits to each symbol. The number of bits/symbol varies with the probability that the symbol occurs in the data based upon an inverse relationship. More particularly, a higher number of bits are assigned to symbols having lower probabilities of occurrences. In contrast, a lower number of bits are assigned to symbols having higher probabilities of occurrences. A variable probability estimation factor is used to determine the number of bits to assign to each symbol of an alphabet by providing faster initial adaptation and update of the probability estimation.

Generally speaking, the variable probability estimation factor allows a balance between convergence to the number of bits to assign to a symbol and the redundancy of using too many bits for each symbol. The variable probability estimation factor is a factor that multiplies each occurrence of a symbol in a set of data set when using a sum of the occurrences of the symbol to determine the probability estimation for the symbol in the set of data. In addition, the variable probability estimation factor may provide a different factor for each coded symbol.

Figure 1:
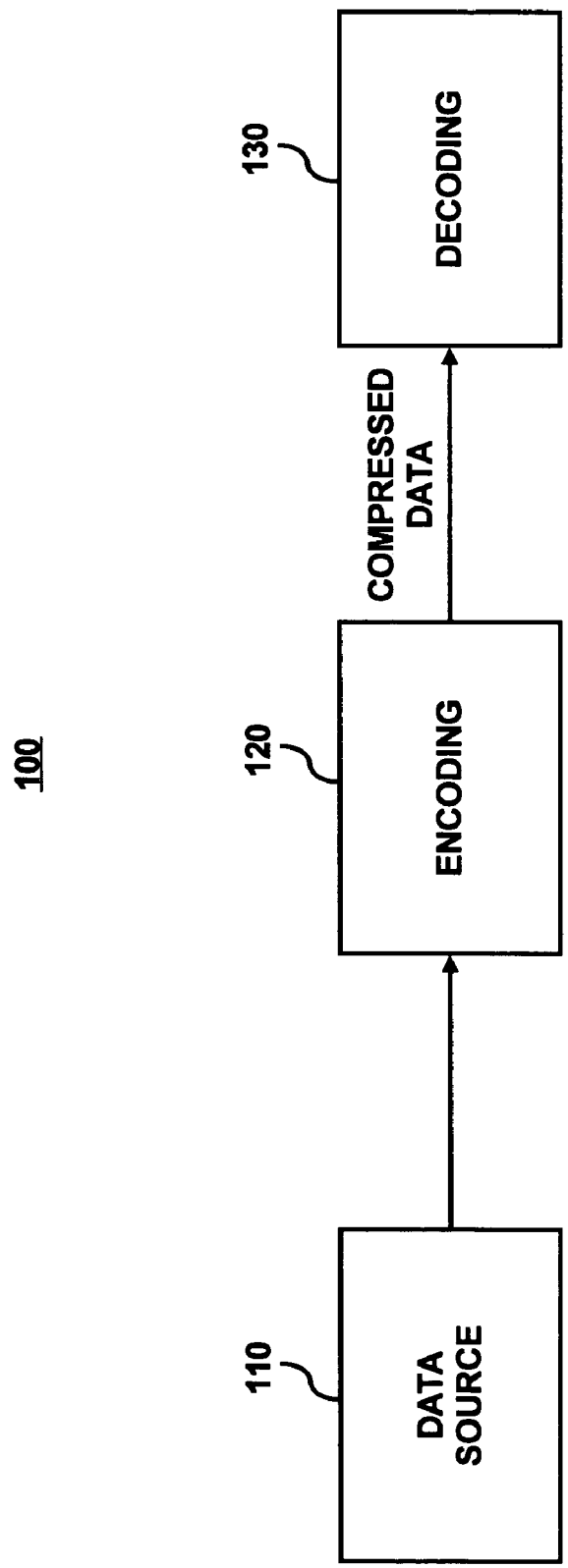
FIG. 1 is a block diagram illustrating an example of a compression system according to an embodiment of the invention.

FIG. 1 is a block diagram illustrating a data compression system 100 usable with various examples discussed herein. The compression system 100 includes a data source 110, an encoding module 120 and a decoding module 130. The data source 110 includes any reasonable suitable type of data source. For example, the data source 110 may be a file including English text where each symbol from the data source 110 is a single byte with the American Standards Committee for Information Interchange ("ASCII") representation of a character. In other examples, the data source 110 may include, for instance, a video file or an image file.

Generally speaking, the encoding module 120 is configured to receive data from the data source 110. The encoding module 120 operates to code the data to produce compressed data. The encoding module 120 is also configured to transmit the compressed data to the decoding module 130. The decoding module 130 generally operates to decode the compressed data to recover the data that was originally coded. According to an embodiment, each of the encoding module 120 and the decoding module 130 use the variable probability estimation factor, described above, to determine a probability estimation which is used to encode and decode data. Various manners in which the encoding module 120 and the decoding module 130 use the variable probability estimation factor are described in greater detail herein below.

The decoding module 130 may be located in a location remote to the encoding module 120. In this example, the compressed data may be recorded in a storage medium to which the decoding module 130 has access. Alternatively, the decoding module 130 may be part of the same system as the encoding module 120. In this example, the encoding module 120 and the decoding module 130 may be part of the same network. In any regard, the modules in the compression system 100 may perform the encoding and decoding functions using arithmetic encoding processes, as described below.

In a first example, the data source 110 is considered to be a data source that outputs symbols $s_k$ coded as integer numbers in the set $\{0, 1, \ldots, M-1\}$, and S is considered to equal $\{s_1, s_2, \ldots, s_N\}$, which are also considered as being a sequence of N random symbols output by the data source 110. In this example, the source symbols are assumed to be independent and identically distributed ("iid"), with probability:

$$p(m) = \text{Prob}\{s_k = m\}, \ m=0,1,2,\ldots, M-1, \ k=1,2,\ldots, N. \quad (1)$$

In addition, it may also be assumed that for all symbols, $p(m) \neq 0$, and $c(m)$ is defined to be the cumulative distribution, $$c(m) = \sum_{s=0}^{m-1} p(s), \ m = 0, 1, \ldots, M. \quad (2)$$

Note that $c(0) \equiv 0$, $c(M) \equiv 1$, and $$p(m) = c(m+1) - c(m). \quad (3)$$

In the following equations, $\overline{p}$ and $\overline{c}$ represent the vectors with all $p(m)$ and $c(m)$ values:

$$\overline{p} = [p(0) p(1) \ldots p(M-1)],$$

$$\overline{c} = [c(0) c(1) \ldots c(M)].$$

The compressed data (the output of the encoding module 120) may be saved in a vector buffer $\overline{d}$. The output alphabet may have D symbols, that is, each element in $\overline{d}$ is a number in the set $\{0, 1, \ldots, D-1\}$ where, typically, D=2 (bits) or D=256 (bytes).

Under the conditions above, an optimal encoding method codes each symbol s from the data source 110 with an average number of bits equal to:

$$B(s) = -\log_2 p(s) \text{ bits.} \quad (4)$$

However, initial assumptions about data sources are rarely found in practical cases. More commonly, the following issues arise.

1. The source symbols are not identically distributed.
2. The symbols in the data sequence are not independent (even if uncorrelated).
3. The probability values, the statistical dependence between symbols, and how they change in time may only be estimated.

These issues may be addressed through various arithmetic encoding techniques described herein below.

Arithmetic encoding generally operates to code one data symbol at a time and to assign a real-valued number of bits to each symbol. An understanding of how arithmetic encoding operates may be obtained through an understanding of the "code value" representation, which may be defined as coded messages mapped to real numbers in the interval [0, 1).

More particularly, the code value v of a compressed data sequence is the real number with fractional digits equal to the sequence's symbols. Sequences may be converted to code values by simply adding "0." to the beginning of a coded sequence, and then interpreting the result as a number in base-D notation, where D is the number of symbols in the coded sequence alphabet. For example, if an encoding method generates the sequence of bits 0011000101100, then:

Code sequence $\overline{d} = [0011000101100]$

Code value $v=0.0011000101100_2=0.19287109375]$ (5)

where the "2" subscript denotes base-2 notation. As is typically the case, the subscript for decimal notation is omitted.

This construction creates a convenient mapping between infinite sequences of symbols from a D-symbol alphabet and real numbers in the interval [0, 1), where any data sequence may be represented by a real number, and vice-versa.

The efficacy of a compression method may be evaluated by analyzing the distribution of the code values it produces. According to Shannon's information theory, if an encoding method is optimal, then the cumulative distribution of its code values has to be a straight line from point (0, 0) to point (1, 1).

A straight-line distribution means that if an encoding method is optimal then there is no statistical dependence or redundancy left in the compressed sequences, and consequently its code values are uniformly distributed on the interval [0, 1). Moreover, code values are an integral part of the arithmetic encoding/decoding procedures, with arithmetic operations applied to real numbers that are directly related to code values.

Fundamentally, the arithmetic encoding process consists of creating a sequence of nested intervals in the form $\Phi_k(S) = [\alpha_k, \beta_k]$, $k=0,1,\ldots, N$, where S is the source data sequence, $\alpha_k$ and $\beta_k$ are real numbers such that $0 \leq \alpha_k \leq \alpha_{k+1}$ and $\beta_{k+1} \leq \beta_k \leq 1$. The arithmetic encoding may be described in a simpler manner by representing the intervals in the form |b,l), where b is called the base or starting point of the interval, and l the length of the interval. The relationship between the traditional and the new interval notation is $$|b,l) = [\alpha, \beta) \text{ if } b = \alpha \text{ and } l = \beta - \alpha. \tag{6}$$

The intervals used during the arithmetic encoding process are, in this new notation, defined by the set of recursive equations [5] and [12].

$$\Phi_0(S) = |b_0, l_0) = |0, 1), \tag{7}$$

$$\Phi_k(S) = |b_k, l_k\rangle = |b_{k-1} + c(s_k)l_{k-1}, p(s_k)l_{k-1}\rangle, k=1,2,\ldots, N. \tag{8}$$

The properties of the intervals cited above guarantee that $0 \leq b_k \leq b_{k+1} < 1$, and that $0 < l_{k+1} < l_k \leq 1$.

Figure 2:
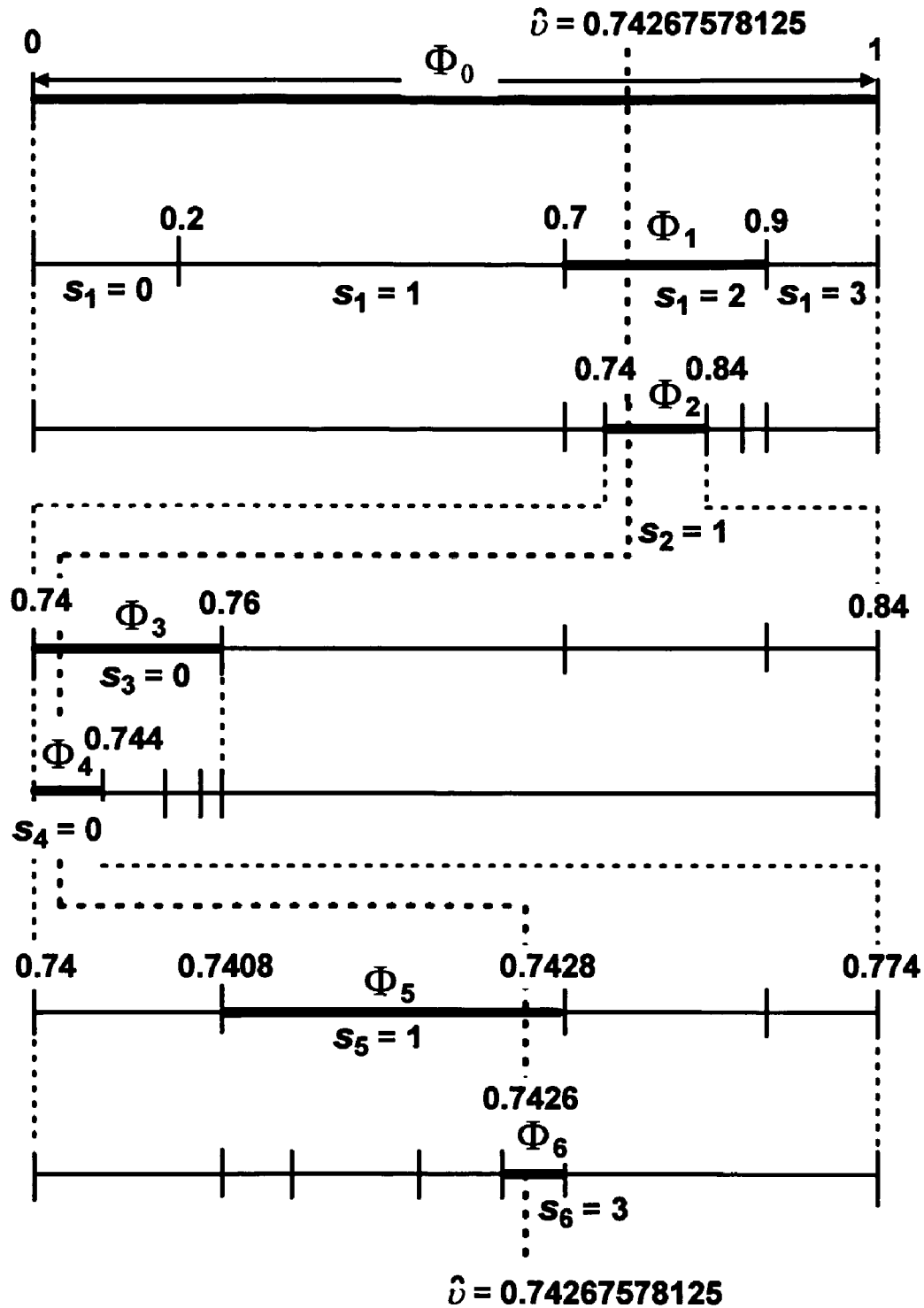
FIG. 2 is a graphical representation of an example of arithmetic encoding, according to an embodiment of the invention.

FIG. 2 shows graphically how the encoding process corresponds to the selection of intervals in the line of real numbers. In the example shown in FIG. 2, the data source 110 has four symbols (M=4), the probabilities and distribution of the symbols are p=[0.2 0.5 0.2 0.1] and c=[0 0.2 0.7 0.9 1], and the sequence of (N=6) symbols to be encoded is S={2, 1, 0,0, 1, 3}.

Starting at the top of FIG. 2, the interval [0, 1) is divided into four subintervals, each having a length equal to the probability of the data symbols. Specifically, the interval [0, 0.2) corresponds to $s_1=0$, the interval [0.2, 0.7) corresponds to $s_1=1$, the interval [0.7, 0.9) corresponds to $s_1=2$, and finally, the interval [0.9, 1) corresponds to $s_1=3$. The next set of allowed nested subintervals also has a length proportional to the probability of the symbols, but their lengths are also proportional to the length of the interval to which they belong. Furthermore, the intervals represent more than one symbol value. For example, interval [0, 0.04) corresponds to $s_1=0$, $s_2=0$, interval [0.04, 0.14) corresponds to $s_1=0$, $s_2=1$, and so on.

The interval lengths are reduced by factors equal to symbol probabilities in order to obtain code values that are uniformly distributed in the interval [0, 1). For example, if 20% of the sequences start with symbol "0", then 20% of the code values must be in the interval assigned to those sequences, which may be achieved if an interval with a length equal to its probability, 0.2, is assigned to the first symbol "0". The same reasoning applies to the assignment of the subinterval lengths: every occurrence of symbol "0" must result in a reduction of the interval length to 20% of its current length. This way, after encoding several symbols, the distribution of code values should be a very good approximation of a uniform distribution.

Equations (7) and (8) provide the formulas for the sequential computation of the intervals. Applying them to the example provides:

$$\Phi_0(S) = |0, 1\rangle = |0, 1\rangle,$$

$$\Phi_1(S) = b_0 + c(2)l_0, p(2)l_0\rangle = |0 + 0.7 \times 1, 0.2 \times 1\rangle = |0.7, 0.9\rangle,$$

$$\Phi_2(S) = b_1 + c(1)l_1, p(1)l_1\rangle = |0.7 + 0.2 \times 0.2, 0.5 \times 0.2\rangle = |0.74, 0.84\rangle,$$

$$\vdots$$

$$\Phi_6(S) = b_5 + c(3)l_5, p(3)l_5\rangle = |0.7426, 0.0002\rangle = |0.7426, 0.7428\rangle,$$

The selected intervals, corresponding to data sequence S={2, 1, 0, 0, 1, 3} are indicated by thicker lines in FIG. 2. The list with all the encoder intervals is shown in Table 1.

TABLE 1

| Iteration k | Input Symbol $s_k$ | Interval base $b_k$ | Interval length $l_k$ | Decoder updated value $\hat{v}_k = \dfrac{\hat{v} - b_{k-1}}{l_{k-1}}$ | Output symbol $\hat{s}_k$ |
|---|---|---|---|---|---|
| 0 | — | 0 | 1 | — | — |
| 1 | 2 | 0.7 | 0.2 | 0.74267578125 | 2 |
| 2 | 1 | 0.74 | 0.1 | 0.21337890625 | 1 |
| 3 | 0 | 0.74 | 0.02 | 0.0267578125 | 0 |
| 4 | 0 | 0.74 | 0.004 | 0.1337890625 | 0 |
| 5 | 1 | 0.7408 | 0.002 | 0.6689453125 | 1 |
| 6 | 3 | 0.7426 | 0.0002 | 0.937890625 | 3 |
| 7 | — | — | — | 0.37890625 | 1 |
| 8 | — | — | — | 0.3578125 | 1 |

Since the intervals quickly become quite small, in FIG. 2, the intervals are graphically magnified twice to observe how the encoding process continues. Note that even though the intervals are shown in different magnifications, the interval values do not change, and the interval subdivision process continues in exactly the same manner.

The final task in arithmetic encoding is to define a code value $\hat{v}(S)$ that will represent data sequence S. The decoding process works correctly for any code value $\hat{v}(S) \in \Phi_N(S)$. However, the code value cannot be provided to the decoder as a pure real number. It is to be stored or transmitted using a conventional number representation. Since the value may be chosen from any value in the final interval, the values with the shortest representation may be desired. In the example shown in Table 1 and FIG. 2, the shortest decimal representation comes from choosing $\hat{v}=0.7427$, and the shortest binary representation is obtained with $\hat{v} = 0.10111110001_2 = 0.74267578125$.

The optimal number of bits required for representing $\hat{v} \in \Phi_N(S)$ is $$B_{min} = -\lceil \log_2(l_N) \rceil \text{ bits}, \tag{9}$$

where [x] represents the smallest integer greater than or equal to x.

In arithmetic encoding, the decoded sequence is determined solely by the code value $\hat{v}$ of the compressed sequence. For that reason, the decoded sequence is represented as $$\hat{S}(\hat{v}) = \{\hat{s}_1(\hat{v}), \hat{s}_2(\hat{v}), \ldots, \hat{s}_N(\hat{v})\} \tag{10}$$

Any code value $\hat{v} \in \Phi_N(S)$ may be used for decoding the correct sequence (that is, $\hat{S}(\hat{v}) = S$) using the following decoding process. A set of recursive equations implement the decoding process. The decoding process recovers the data symbols in the same sequence that they were coded. To find the numerical solution, a sequence of normalized code values $\{\vec{v}_1, \vec{v}_2, \ldots, \vec{v}_N\}$. Starting with $\vec{v}_1 = \hat{v}$ $\hat{s}_k$ is found from $\vec{v}_k$. Then $\vec{v}_{k+1}$ is computed from $\vec{s}_k$ and $\vec{v}_k$.

The recursion formulas are $$\vec{v}_1 = \vec{v}, \tag{11}$$

$$\hat{s}_k(\hat{v}) = \{s : c(s) \leq \vec{v}_k < c(s+1)\}, k=1,2,\ldots,N, \tag{12}$$

(where ":" indicates "satisfies the inequalities") and $$\vec{v}_{k+1} = \frac{\vec{v}_k - c(\hat{s}_k(\hat{v}))}{p(\hat{s}_k(\hat{v}))}, \quad k = 1, 2, \ldots, N-1. \quad (13)$$

A mathematically equivalent decoding method—to work with fixed-precision arithmetic—recovers the sequence of intervals created by the encoding module 120, and searches for the correct value $\hat{s}_k(\hat{v})$ in each of these intervals. The mathematically equivalent decoding method is defined by:

$$\Phi_0(\hat{S}) = |b_0, l_0) = |0, 1), \quad (14)$$

$$\hat{s}_k(\hat{v}) = \left\{ s : c(s) \le \frac{\hat{v} - b_{k-1}}{l_{k-1}} < c(s+1) \right\}, \quad k = 1, 2, \ldots, N, \quad (15)$$

$$|\Phi_k(\hat{S}) = |b_k, l_k) = |b_{k-1} + c(\hat{s}_k(\hat{v}))l_{k-1}, p(\hat{s}_k(\hat{v}))l_{k-1}),$$
$$k = 1, 2, \ldots, N. \quad (16)$$

In the examples above, it was assumed that the data source 110 was stationary, so that there was one set of symbol probabilities for encoding and decoding all symbols in the data sequence S. However, there are situations where the probabilities change for each symbol coded, that is, the k-th symbol in the data sequence S is a random variable with probabilities $\bar{p}_k$ and distribution $c_k$. The only required change in the arithmetic encoding process is, instead of using equation (8) for interval updating, to use:

$$\Phi_k(S) = |b_k, l_k) = |b_{k-1} + c_k(s_k)l_{k-1}, p_k(s_k)l_{k-1}), k = 1, 2, \ldots, N. \quad (17)$$

In the decoding process, the process of working with updated code values is equivalent to "erasing" all information about past symbols, and decoding in the [0, 1) interval. Thus, the decoding module 130 only has to use the right set of probabilities for that symbol to decode it correctly. The changes to equations (15) and (16) yield:

$$\hat{s}_k(\hat{v}) = \left\{ s : c_k(s) \le \frac{\hat{v} - b_{k-1}}{l_{k-1}} < c_k(s+1) \right\}, \quad k = 1, 2, \ldots, N, \quad (18)$$

$$|\Phi_k(S) = |b_k, l_k) = |b_{k-1} + c_k(\hat{s}_k(\hat{v}))l_{k-1}, p_k(\hat{s}_k(\hat{v}))l_{k-1}), k = 1, 2, \ldots, N. \quad (19)$$

Note that the number of symbols used at each instant may change. In addition, instead of having a single input alphabet with M symbols, there may be a sequence of alphabet sizes $\{M_1, M_2, \ldots, M_N\}$.

In data compression, the encoding module 120 may change its behavior (parameters, encoding algorithm, etc.) while encoding a data sequence, as long as the decoding module 130 uses the same information and the same rules to change its behavior. In addition, these changes may be "synchronized," not in time, but in relation to the sequence of data source symbols.

For example, the encoding module 120 and decoding module 130 may be synchronized in their use of varying sets of probabilities. All of the probabilities do not have to be assumed as being available to the decoding module 130 when the decoding module 130 starts decoding. The probability vectors may be updated with any reasonably suitable rule based on symbol occurrences, as long as the vector $\bar{p}_k$ is computed from the data already available to the decoder, that is, $\{\hat{s}_1, \hat{s}_2, \ldots, \hat{s}_{k-1}\}$.

This concept of synchronization is used for arithmetic encoding because it involves a nonlinear dynamic system, and error accumulation leads to incorrect decoding, unless the encoder and decoder use exactly the same implementation (same precision, number of hits, rounding rules, equations, tables, etc.). In other words, arithmetic encoding may be made to work correctly even if the encoder makes coarse approximations, as long as the decoder makes exactly the same approximations.

Figure 3A:
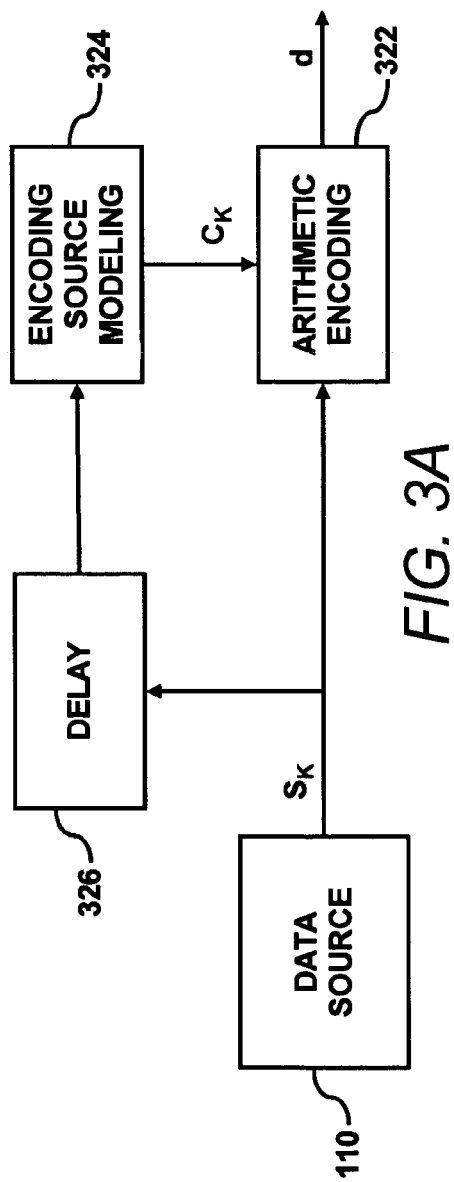
FIG. 3A is a block diagram illustrating an example of an arithmetic encoding system, according to an embodiment of the invention.
Figure 3B:
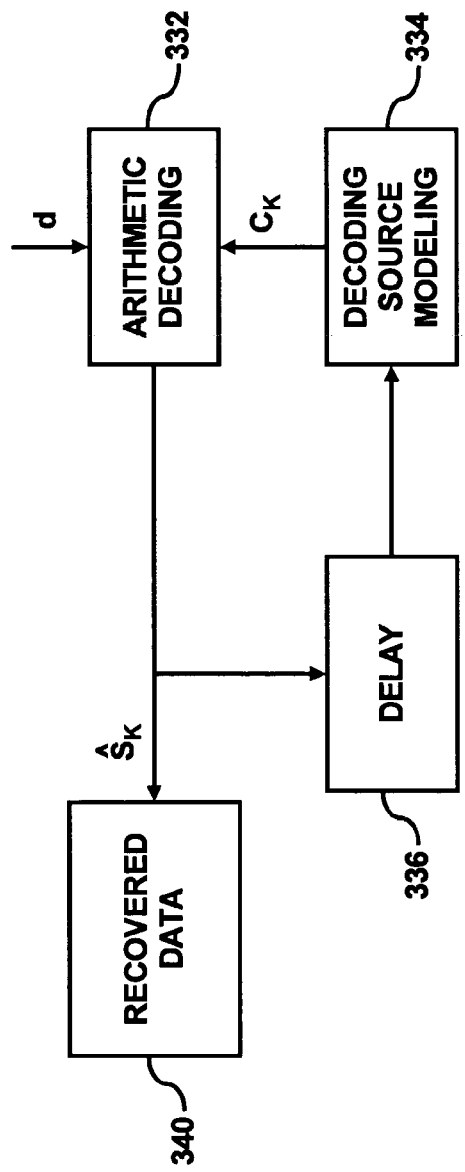
FIG. 3B is a block diagram illustrating an example of an arithmetic decoding system, according to an embodiment of the invention.

FIGS. 3A and 3B are block diagrams illustrating a compression system where the source modeling and encoding processes of encoding module 120 are separated. There are many advantages for separating the source modeling (probabilities estimation) and the encoding processes. For example, it allows development of complex compression schemes without worrying about the details in the encoding algorithm, and/or using them with different encoding methods and implementations.

FIGS. 3A and 3B show how the two processes may be separated in a complete system for arithmetic encoding and decoding. As shown in FIG. 3A, data $s_k$ from the data source 110 is received by an arithmetic encoding module 322. The data $s_k$ also passes through an encoding delay module 326 to an encoding source modeling module 324. The encoding source modeling module 324 determines the distribution $c_k$ for the data $s_k$, and forwards the distribution $c_k$ to the arithmetic encoding module 322. The distribution $c_k$ is used by the arithmetic encoding module 322 to produce encoded data d.

As shown in FIG. 3B, the encoded data d is received by the arithmetic decoding module 332, which decodes the encoded data d to produce recovered data $\hat{s}_k$. The recovered data $\hat{s}_k$ is forwarded to a recovered data module 340 for storage or presentation. The recovered data $\hat{s}_k$ also passes through a decoding delay module 336 to a decoding source modeling module 334. The decoding source modeling module determines the distribution $c_k$ for the recovered data, and forwards the distribution $c_k$ to the arithmetic decoding module 332.

The modeling modules, that is, the encoding source module 324 and the decoding source modeling module 334, are responsible for updating the intervals. The encoding/decoding processes use probability distribution vectors as input, but do not change them in any manner. The source modeling modules 324, 334 are responsible for choosing the distribution $c_k$ that is used to encode/decode symbol $s_k$. For correct decoding, the decoding source modeling module 334 must be identical to module 324. FIGS. 3A and 3B also show that a delay 326, 336 of one data symbol before the source-modeling block substantially guarantees that the encoding source module 324 and decoding source modeling module 334 use the same information to update the vector $c_k$. The delay substantially guarantees that the two modules 324, 334 are "synchronized", that is, the encoding source module 324 may not use the knowledge of the symbol it is currently coding to change $c_k$, since that information is not yet available at the decoding source module 324. With the delay, not only are the encoding source module 324 and the decoding source modeling module 334 equal, their inputs and outputs are also equal.

The following description is directed to an implementation of the encoding source module 324 and the decoding source modeling module 334 to improve arithmetic coding compression performance. As stated above, the encoding source module 324 and the decoding source modeling module 334 are synchronized. It should be noted that optimal compression occurs when the estimated probability values used for coding are equal to the actual probabilities. As such, any difference may produce sub-optimal coding.

However, since a truly general implementation cannot start with a specific assumption about the probability of the data symbols, one choice is to initially assume that all symbols are equally probable, and then update the estimated probabilities as the symbols are encoded. Although this approach works well for long sequences of symbols to be encoded, the accuracy of probability estimates for large alphabets may improve slowly. Thus, the encoding process may be sub-optimal during this "learning" stage, and a good compression may not be obtained for short sequences of data symbols.

One approach is to sequentially add a symbol to the data alphabet only after the first occurrence of the symbol in the sequence to be coded. However, the required bookkeeping for this approach may slow down the encoding and decoding processes. Another approach is to use a probability estimation factor to increment an occurrence $E_n(s)$ sum of each symbol whenever the symbol is coded, as discussed with reference to FIG. 4.

Figure 4:
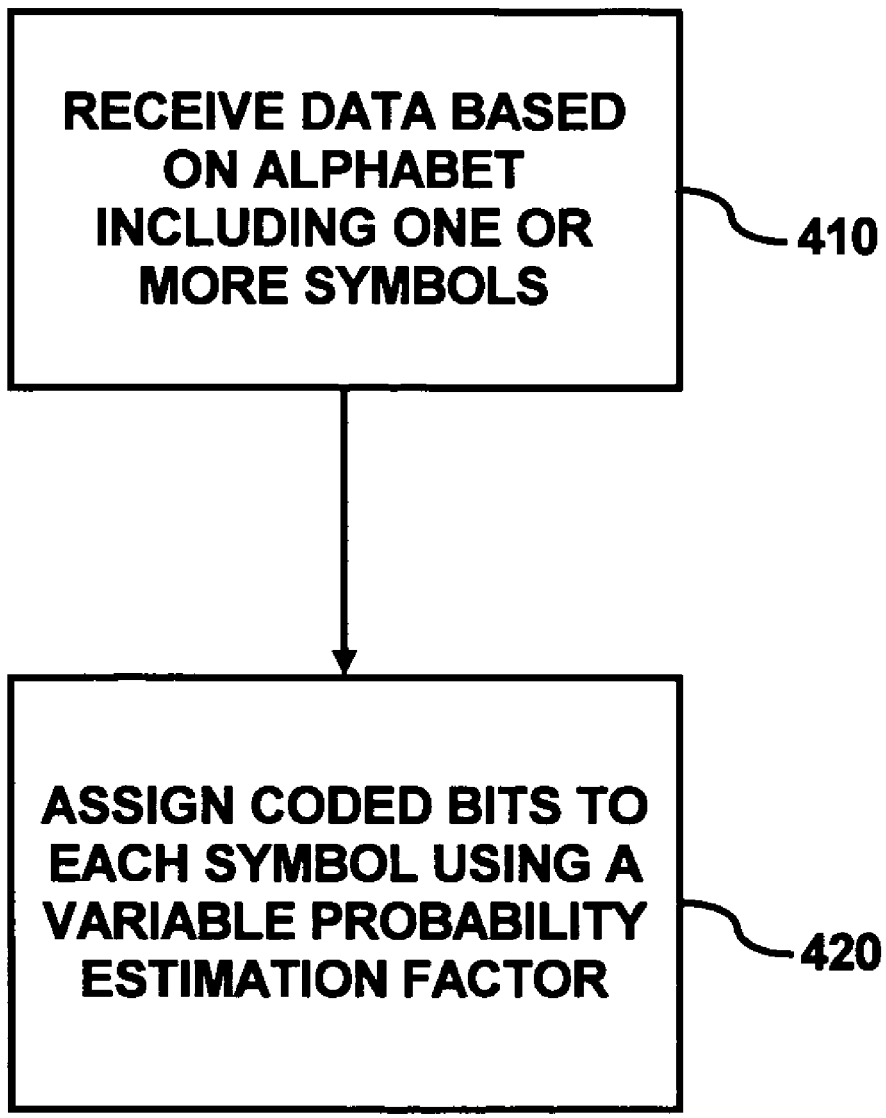
FIG. 4 is a flow diagram illustrating an example of a method of encoding data, according to an embodiment of the invention.

FIG. 4 is a flow diagram illustrating a method 400 of a method of encoding data. It is to be understood that the following description of the method 400 is but one manner of a variety of different manners in which a method of encoding data may be practiced. It should also be apparent to those of ordinary skill in the art that the method 400 represents a generalized illustration and that other steps may be added or existing steps may be removed, modified or rearranged without departing from a scope of the method 400.

The description of the method 400 is made with reference to FIGS. 1, 3A and 3B, and thus makes reference to the elements cited therein. It should, however, be understood that the method 400 is not limited to the elements set forth in FIGS. 1, 3A and 3B. Instead, it should be understood that the method 400 may be practiced by encoding and decoding modules having different configurations than those set forth in FIGS. 1, 3A and 3B.

The method 400 may be initiated or started as indicated at step 410. At step 410, data to be encoded is received at an encoding module 120, as shown in FIG. 1. The data may include a sequence of data and may be based on an alphabet including one or more symbols.

At step 420, the coded bits are assigned to each symbol using a variable probability estimation factor. The coded bits are assigned to each symbol in the arithmetic encoding module 322. The coded bits are assigned based on a probability estimation generated in the 324 using the variable probability estimation factor, as described below.

The sequence of symbols to be coded may be represented as $\{s_1, s_2, \ldots, s_N\}$, where each data symbol $s_n$ belongs to alphabet A=$\{1, 2, \ldots, M-1\}$. An indicator function may be defined as:

$$\partial(s) = \begin{cases} 1, & s = 0 \\ 0, & s \neq 0 \end{cases}, \quad (20)$$

and $E_n(s)$ may be used to represent the following symbol-occurrence sum:

$$E_n(s) = \sum_{k=1}^{n} w_k \partial(s - s_k), \quad (21)$$

where $w_k$ represents a variable probability estimation factor. Note that if the sequence $w_k \equiv 1$, then $E_n(s)$ represents the number of occurrences of symbol s in the sequence $\{s_1, s_2, s_N\}$.

A sum $T_n$ is defined as $$T_n = \sum_{s=0}^{M-1} E_n(s). \quad (22)$$

For estimating the symbol probabilities, it is considered that no entropy-coding method may effectively code data symbols that have estimated probabilities equal to zero. This happens because this is logically equivalent to the occurrence of an impossible event. For arithmetic encoding, using a zero probability estimate causes the encoding interval to collapse to a single point, making further encoding impossible.

This problem may be avoided if, after encoding n data symbols, the probabilities are estimated using:

$$\hat{p}_n(s) = \frac{1 + E_n(s)}{M + T_n}, \quad s = 0, 2, \ldots, M - 1. \quad (23)$$

With this definition, encoding is started with the assumption that all symbols are equally probable, since:

$$\hat{p}_0(s) = \frac{1}{M}, \quad s = 0, 2, \ldots, M - 1. \quad (24)$$

With these probability estimates, the number of bits used by the arithmetic encoding method to code symbol $s_n$ is equal to $\log_2[1/\hat{p}_{n-1}(s_n)]$.

The simplest form of updating probability estimates is through use of $w_k \equiv 1$, that is, incrementing the counter $E_n(s)$ by one whenever symbol s is coded. While this approach has the lowest complexity, its disadvantage is that for a large alphabet it causes the estimates of the low-probability symbols to converge to small values quite slowly.

For example, if an alphabet has 256 symbols, but the source is such that only one symbol actually occurs (i.e., has low entropy), an effective adaptive encoding method should quickly detect this fact, and code this symbol with a number of bits that rapidly approaches zero. However, if $w_k \equiv 1$ is used, the following sequence of number of bits occurs, $\log_2(256/1), \log_2(257/2), \log_2(258/3), \log_2(259/4) \ldots =$
8, 7.01, 6.43, 6.02 . . .

In another approach, a binary search tree may be generated, such as those described in *Introduction to Arithmetic Coding Theory and Practice*, A. Said, HPL-2004-76, April 2004, herein incorporated by reference. Thus, if only binary arithmetic coders are used in a flat 256-node binary search tree, then the number of coded bits decreases at a faster rate, because each symbol is coded by a sequence of eight binary encoders, each adapting faster because of their small alphabet. In this approach, the following sequence of number of bits occurs, 8 log$_2$(2/1),8 log$_2$(3/2),8 log$_2$(4/3)8 log$_2$(5/4)=8,4.68, 3.32,2.58 . . .

However, this approach requires eight consecutive encoding stages for each symbol, and can slow the encoding process significantly. Alternatively, a similarly fast decrease may be found if larger values of $w_k$ are used. For instance, if $w_k$=16, then the following sequence of number of bits occurs, log$_2$(256/1),log$_2$(272/17),log$_2$(288/33), log$_2$(304/49) . . . =8,4.00,3.13,2.63 . . .

The example above shows that larger values of $w_k$ lead to a faster decrease of the estimates of the probability of the less-frequent data symbols. However, the drawback for using values of $w_k$ that are too large is that there is inefficiency when the symbols are equally probable. For example, if $w_k$=1 and $s_1 \neq s_2$, then $s_2$ is coded with log$_2$(257)=8.01 bits. And, if $w_1$=16, $s_2$ is coded with log$_2$(272)=8.09 bits.

There is a trade-off between fast adaptation for low-entropy sources and extra redundancy on uniform distributions. According to an example, one approach is to choose a variable probability estimation factor $w_k$ that allows a fast initial adaptation, but that keeps the redundancy for uniform distributions within an acceptable range. Thus, the number of bits to assign to each symbol will converge more quickly to an optimal number for low probability symbols while the number of unnecessary bits assigned for uniform distributions is minimized.

One example of a variable probability estimation factor $w_k$ is shown by $$w_k = [3.5 + 7e^{-0.08k}], k=1,2, \ldots, N. \quad (25)$$

There are many choices for defining the sequence $w_k$. Some examples are $$w_k = \min\{w_{min}, [w_{max} - \alpha k]\}, k=1,2, \ldots, N, \quad (26)$$

$$w_k = w_{min} + [\alpha e^{-\beta k}], k=1,2, \ldots, N, \quad (27)$$

$$w_k = \min\{w_{min}, [\alpha e^{-\beta k}]\}, k=1,2, \ldots, N, \quad (28)$$

$$w_k = w_{min} + \left[\frac{\alpha}{1 + \beta k^\gamma}\right], \quad k = 1, 2, \ldots, N, \quad (29)$$

where $\alpha$, $\beta$, and $\gamma$ are constants chosen to obtain the desired combination of adaptation speed and low redundancy, and to vary according to the alphabet size M.

For instance, equation (25) provides a sequence that was specifically designed for sources with 64 symbols. As another example, the value of $w_1$ that halves the number of bits used to code $s_2$ if $s_1 \neq s_2$ is such that:

$$\log_2(M) = 2 \log_2\left(\frac{M + w_1}{1 + w_1}\right) \Longrightarrow w_1 = \sqrt{M}, \quad (30)$$

that is, $w_k$ it is a simple function of M.

The sequence $w_k$ that produces results that are the same as those obtained with a flat tree of binary encoders may be computed using the recursive computation:

$$w_k = \left[\frac{(1+k)^B(M + \tau_{k-1}) - (2+k)^B(1 + \tau_{k-1})}{(2+k)^B - (1+k)^B}\right], \quad k = 1, 2, \ldots, N, \quad (31)$$

where B=log$_2$(M), and $$\tau_k = \sum_{i=1}^{k} w_i. \quad (32)$$

It may be noted that the values of $w_k$ satisfying the equation above quickly converge to (M−1)/log$_2$(M).

Figure 5:
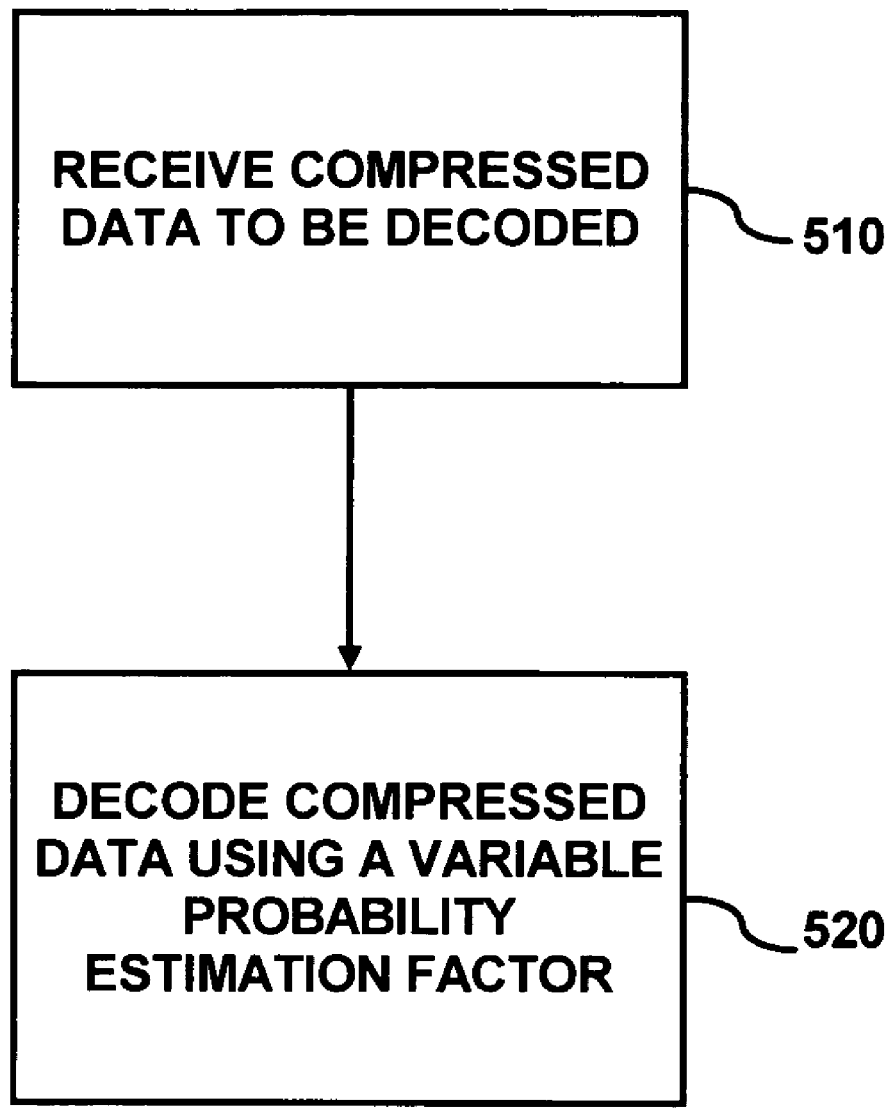
FIG. 5 is a flow diagram illustrating an example of a method of decoding data, according to an embodiment of the invention.

FIG. 5 is a flow diagram illustrating an example of a method of decoding data 500, according to an embodiment of the invention. At step 510, compressed data (including coded bits) to be decoded is received at a decoding module 130, as shown in FIG. 1. The bits encoded based on the variable probability estimation factor $w_k$ may be transmitted to the decoding module 130, as shown in FIG. 1. The bits may be transmitted over a network or recorded onto a storage medium which the decoding module 130 may access.

At step 520, the received compressed data is decoded to recover each symbol of the encoded data. The received compressed data is decoded based on a probability estimation using a variable probability estimation factor. The decoding produces recovered data. In one example, the decoding source modeling module 334 determines coded bits assigned to each symbol of the compressed data using the variable probability estimation factor $w_k$ described above. The arithmetic decoding module 332 may use the determined coded bits assigned to each symbol to decode the compressed data. In other words, the arithmetic decoding module 332 decodes the encoded bits to recover the symbols from the coded bits.

The decoding source modeling module 334, as shown in FIG. 3B, uses the variable probability estimation factor $w_k$ to decode the encoded bits to recover the data. As described above, the decoding source modeling module 334 is identical to the encoding source modeling module 324. Thus, the operation of the decoding source modeling module 334 is the same as the operation of the encoding source modeling module 324.

Therefore, the parameters $\alpha$, $\beta$, and $\gamma$ (or any other set of parameters) used by the arithmetic encoding module 322 are the same as those used by the arithmetic decoding module 332.

In one embodiment, a compression system may be designed so that the encoder 322 and the decoder 332 always use the same pre-defined parameters. The encoder 322 may write the parameters in the header of a particular file, and both the encoder 322 and the decoder 332 may use the values in the particular file. The encoder 322 and the decoder 332 may use some type of predetermined communications protocol to define and/or change parameters.

Figure 6:
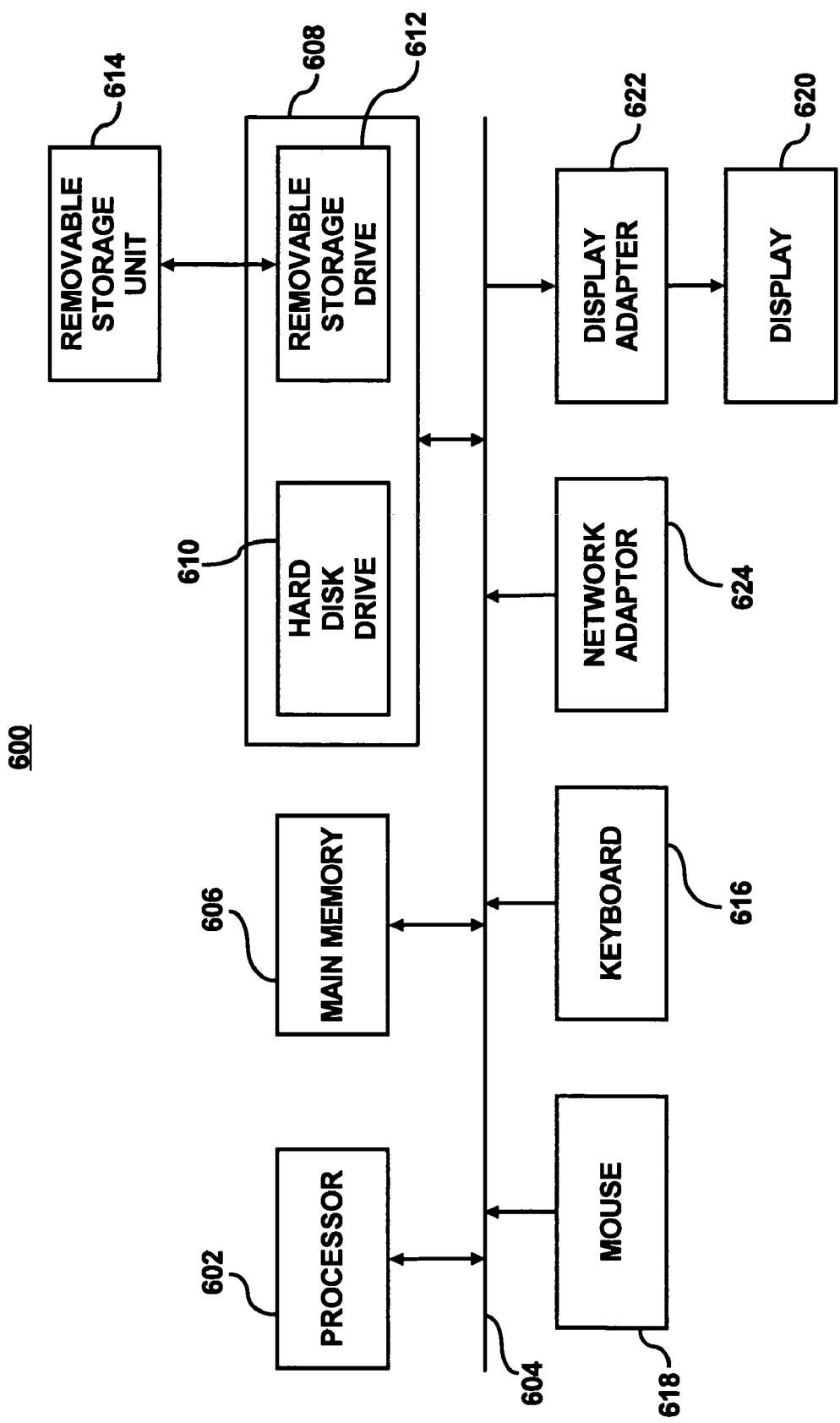
FIG. 6 is a block diagram illustrating a computer system operable to perform the methods depicted in FIGS. 4 and 5, according to an embodiment of the invention.

FIG. 6 illustrates an exemplary computer system 600 operable to control the encoding process described with respect to the methods shown in FIGS. 4 and 5. In this respect, the computer system 600 may be used as a platform for executing one or more of the functions described hereinabove with respect to the various steps outlined in the methods 400, 500. For instance, the implementation of the computer system 600 may be configured to execute at least the steps of receiving data to be encoded, assigning coded bits to each symbol of the received data based on a probability estimation using a variable probability estimation factor, receiving compressed data, and decoding the compressed data to recover each symbol of the received data based on a probability estimation using the variable probability estimation factor.

The computer system 600 includes one or more controllers, such as a processor 602. The processor 602 may be used to execute some or all of the steps described in the methods 400 and 500. Commands and data from the processor 602 are communicated over a communication bus 604. The computer system 600 also includes a main memory 606, such as a random access memory (RAM), where a program code may be executed during runtime, and a secondary memory 608. The secondary memory 608 includes, for example, one or more hard disk drives 610 and/or a removable storage drive 612, representing a floppy diskette drive, a magnetic tape drive, a compact disk drive, etc., where a copy of the program code for the methods 400, 500 may be stored.

The removable storage drive 612 reads from and/or writes to a removable storage unit 614 in a well-known manner. User input and output devices may include a keyboard 616, a mouse 618, and a display 620. A display adaptor 622 may interface with the communication bus 604 and the display 620 and may receive display data from the processor 602 and convert the display data into display commands for the display 620. In addition, the processor 602 may communicate over a network, for instance, the Internet, LAN, etc., through a network adaptor 624.

It will be apparent to one of ordinary skill in the art that other known electronic components may be added or substituted in the computer system 600. In addition, the computer system 600 may include a system board or blade used in a rack in a data center, a conventional "white box" server or computing device, etc. Also, one or more of the components in FIG. 6 may be optional (for instance, user input devices, secondary memory, etc.).

What has been described and illustrated herein is a preferred embodiment along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A data compression method, the method comprising:
   receiving data to be encoded, the received data based on an alphabet including one or more symbols; and
   assigning coded bits to each symbol of the received data based on a probability estimation using a variable probability estimation factor, wherein the variable probability estimation factor comprises a factor selected to converge to a logarithmic function relative to the size of the alphabet.

2. The method of claim 1, further comprising:
   receiving compressed data, the compressed data including the coded bits representing the received data; and
   decoding the compressed data to recover each symbol of the received data based on a probability estimation using the variable probability estimation factor, wherein the decoding produces recovered data.

3. The method of claim 2, wherein the step of decoding the compressed data to recover each symbol of the received data further comprises multiplying each occurrence of a symbol in the recovered data with the variable probability estimation factor when using a sum of the occurrences of the symbol to determine the probability estimation.

4. The method of claim 1, wherein assigning coded bits to each symbol of the received data based on the probability estimation using the variable probability estimation factor comprises multiplying each occurrence of a symbol in the received data with the variable probability estimation factor when using a sum of the occurrences of the symbol to determine the probability estimation.

5. The method of claim 1, wherein the step of assigning coded bits to each symbol of the received data based on the probability estimation using the variable probability estimation factor further comprises varying the variable probability estimation factor according to the number of symbols in the alphabet.

6. The method of claim 1, wherein the step of assigning coded bits to each symbol of the received data based on the probability estimation using the variable probability estimation factor further comprises selecting the variable probability estimation factor as a simple function of the size of the alphabet.

7. The method of claim 1, wherein the step of assigning coded bits to each symbol of the received data based on the probability estimation using the variable probability estimation factor further comprises varying the variable probability estimation factor to obtain a desired combination of adaptation speed and low redundancy for assigning coded bits to each symbol.

8. The method of claim 1, wherein the step of receiving the data further comprises receiving data based on a plurality of alphabets.

9. A data compression method, the method comprising:
   receiving data to be encoded, the received data based on an alphabet including one or more symbols; and
   assigning coded bits to each symbol of the received data based on a probability estimation using a variable probability estimation factor;
   determining the probability estimation using the variable probability estimation factor by using the equation:

$$\hat{p}_n(s) = \frac{1 + E_n(s)}{M + T_n}, \quad s = 1, 2, \ldots, M,$$

wherein $\hat{p}_n(s)$ represents the probability, s represents the symbols in the alphabet, and $E_n(s)$ represents a symbol-occurrence sum where:

$$E_n(s) = \sum_{k=1}^{n} w_k \partial(s - d_k),$$

wherein $w_k$ represents the variable probability estimation factor and $\partial(s)$ represents an indicator function where $$\partial(s) = \begin{cases} 1, & s = 0 \\ 0, & s \neq 0 \end{cases}.$$

10. The method of claim 9, wherein the step of determining the probability estimation further comprises using the variable probability estimation factor represented by the equation:

$$w_k = \min\{w_{min}, [w_{max} - \alpha k]\}, k=1,2,\ldots N,$$

wherein $\alpha$ is a constant, and k represents the number of symbols in the received data.

11. The method of claim 9, wherein the step of determining the probability estimation further comprises using the variable probability estimation factor is represented by the equation:

$$w_k = w_{min} + \alpha e^{-\beta k}], k=1,2,\ldots,N,$$

wherein $\alpha$ and $\beta$ are constants, and k represents the number of symbols in the received data.

12. The method of claim 9, wherein the step of determining the probability estimation further comprises using the variable probability estimation factor is represented by the equation:

$$w_k = \min\{w_{min}, [\alpha e^{-\beta k}]\}, k=1,2,\ldots,N,$$

wherein $\alpha$ and $\beta$ are constants, and k represents the number of symbols in the received data.

13. The method of claim 9, wherein the step of determining the probability estimation further comprises using the variable probability estimation factor is represented by the equation:

$$w_k = w_{min} + \left[\frac{\alpha}{1+\beta k^\gamma}\right], \quad k=1,2,\ldots,N,$$

wherein $\alpha$, $\beta$ and $\gamma$ are constants and k represents the number of symbols in the received data.

14. The method of claim 9, wherein the step of determining the probability estimation further comprises selecting the variable probability estimation factor $w_k$ to converge to $(M-1)/\log_2(M)$, where M represents the site of the alphabet.

15. An apparatus for data compression, the apparatus comprising:
a data source configured to store data based on an alphabet including one or more symbols; and
an encoding module configured to receive data from the data source and assign coded bits to each symbol of the received data based on a probability estimation using a variable probability estimation factor, wherein the variable probability estimation factor comprises a factor selected to converge to a logarithmic function relative to the size of the alphabet.

16. The apparatus of claim 15, further comprising a decoding module configured to receive encoded data from the encoding module and decode each symbol of the received encoded data based on a probability estimation using a variable probability estimation factor.

17. The apparatus of claim 16, wherein the decoding module and the encoding module are synchronized.

18. The apparatus of claim 16, wherein the decoding module comprises a decoding source modeling module, the decoding source modeling module configured to determine the probability estimation using the variable probability estimation factor by using the equation $$\hat{p}_n(s) = \frac{1+E_n(s)}{M+T_n}, \quad s=1,2,\ldots,M,$$

wherein $\hat{p}_n(s)$ represents the probability, s represents the symbols in the alphabet, and $E_n(s)$ represents a symbol-occurrence sum where $$E_n(s) = \sum_{k=1}^{n} w_k \partial(s - s_k),$$

wherein $w_k$ represents the variable probability estimation factor and $\partial(s)$ represents an indicator function where $$\partial(s) = \begin{cases} 1, & s=0 \\ 0, & s \neq 0 \end{cases}.$$

19. The apparatus of claim 16, wherein the decoding module is further configured to select the variable probability estimation factor wk to converge to $(M-1)/\log_2(M)$, where M represents the size of the alphabet.

20. The apparatus of claim 15, wherein the encoding module is further configured to vary the variable probability estimation factor according to the number of symbols in the alphabet.

21. The apparatus of claim 15, wherein the encoding module is further configured to select the variable probability estimation factor as a simple function of the size of the alphabet.

22. The apparatus of claim 15, wherein the encoding module is further configured to vary the variable probability estimation factor to obtain a desired combination of adaptation speed and low redundancy for assigning coded bits to each symbol.

23. The apparatus of claim 15, wherein the encoding module further comprises an encoding source modeling module, the encoding source modeling module configured to determine the probability estimation using the variable probability estimation factor by using the equation $$\hat{p}_n(s) = \frac{1+E_n(s)}{M+T_n}, \quad s=1,2,\ldots,M,$$

wherein $\hat{p}_n(s)$ represents the probability, s represents the symbols in the alphabet, and $E_n(s)$ represents a symbol-occurrence sum where $$E_n(s) = \sum_{k=1}^{n} w_k \partial(s - s_k),$$

wherein $w_k$ represents the variable probability estimation factor and $\partial(s)$ represents an indicator function where $$\partial(s) = \begin{cases} 1, & s = 0 \\ 0, & s \neq 0 \end{cases}.$$

24. The apparatus of claim 15, wherein the encoding module is further configured to select the variable probability estimation factor $w_k$ to converge to $(M-1)/\log_2(M)$, where M represents the size of the alphabet.

25. A system for data compression, the system comprising:
   means for receiving data to be encoded, the received data based on an alphabet including one or more symbols; and
   means for assigning coded bits to each symbol of the received data based on a probability estimation using a variable probability estimation factor, wherein the variable probability estimation factor comprises a factor selected to converge to a logarithmic function relative to the size of the alphabet.

26. The system of claim 25, further comprising:
   means for receiving compressed data, the compressed data including the coded bits representing the received data; and
   means for decoding the compressed data to recover each symbol of the received data based on a probability estimation using the variable probability estimation factor, wherein the means for decoding produces recovered data.

27. A computer readable storage medium on which is embedded one or more computer programs, said one or more computer programs implementing a data compression method, said one or more computer programs comprising a set of instructions for:
   receiving data to be encoded, the received data based on an alphabet including one or more symbols; and
   assigning coded bits to each symbol of the received data based on a probability estimation using a variable probability estimation factor, wherein the variable probability estimation factor comprises a factor selected to converge to a logarithmic function relative to the size of the alphabet.

28. The computer readable storage medium of claim 27, wherein the variable probability estimation factor is varied to obtain a desired combination of adaptation speed and low redundancy for assigning coded bits to each symbol.

29. The computer readable medium of claim 27, further comprising:
   a set of instructions for determining the probability estimation using the variable probability estimation factor by using the equation:

$$\bar{p}_n(s) = \frac{1 + E_n(s)}{M + T_n}, \quad s = 1, 2, \ldots, M,$$

wherein $\bar{p}_n(s)$ represents the probability, s represents the symbols in the alphabet, and $E_n(s)$ represents a symbol-occurrence sum where $$E_n(s) = \sum_{k=1}^{n} w_k \partial(s - s_k),$$

wherein $w_k$ represents the variable probability estimation factor and $\partial(s)$ represents an indicator function where $$\partial(s) = \begin{cases} 1, & s = 0 \\ 0, & s \neq 0 \end{cases}.$$

30. The computer readable storage medium of claim 27, further comprising a set of instructions for:
   receiving compressed data, the compressed data including the coded bits representing the received data; and
   decoding the compressed data to recover each symbol of the received data based on the probability estimation using a variable probability estimation factor, wherein the decoding produces recovered data.

* * * * *

UNITED STATES PATENT AND TRADEMARK OFFICE
CERTIFICATE OF CORRECTION

| | |
|---|---|
| PATENT NO. | : 7,053,803 B1 |
| APPLICATION NO. | : 11/060730 |
| DATED | : May 30, 2006 |
| INVENTOR(S) | : Amir Said |

Page 1 of 1

It is certified that error appears in the above-identified patent and that said Letters Patent is hereby corrected as shown below:

On the Title page, in Item (73), in "Assignee", in column 1, line 1, delete "Hewlett Packard" and insert -- Hewlett-Packard --, therefor.

In column 15, line 40, in Claim 13, delete "γare" and insert -- $\gamma$ are --, therefor.

In column 15, line 45, in Claim 14, delete "site" and insert -- size --, therefor.

In column 16, line 29, in Claim 19, delete "wk" and insert -- $w_k$ --, therefor.

Signed and Sealed this

Nineteenth Day of January, 2010

David J. Kappos
*Director of the United States Patent and Trademark Office*